United States Patent
Kaiser et al.

(10) Patent No.: US 8,493,695 B1
(45) Date of Patent: Jul. 23, 2013

(54) METHOD AND SYSTEM FOR PROVIDING A MAGNETIC READ TRANSDUCER HAVING AN IMPROVED SIGNAL TO NOISE RATIO

(75) Inventors: Christian Kaiser, San Jose, CA (US);
Qunwen Leng, Palo Alto, CA (US);
Mahendra Pakala, Fremont, CA (US);
Daniele Mauri, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 77 days.

(21) Appl. No.: 13/170,506

(22) Filed: Jun. 28, 2011

(51) Int. Cl.
*G11B 5/39* (2006.01)

(52) U.S. Cl.
USPC .................................................. 360/324.12

(58) Field of Classification Search
USPC .................................................. 360/324.12
See application file for complete search history.

(56) References Cited

U.S. PATENT DOCUMENTS

| | | | |
|---|---|---|---|
| 6,556,390 B1 | 4/2003 | Mao et al. | |
| 6,613,380 B1 | 9/2003 | Gill | |
| 6,795,279 B2 | 9/2004 | Singleton et al. | |
| 7,126,202 B2 | 10/2006 | Huai et al. | |
| 7,196,880 B1 | 3/2007 | Anderson et al. | |
| 7,417,832 B1 | 8/2008 | Erickson et al. | |
| 7,480,173 B2 | 1/2009 | Guo et al. | |
| 7,508,042 B2 | 3/2009 | Guo | |
| 7,684,160 B1 | 3/2010 | Erickson et al. | |
| 7,821,748 B2 | 10/2010 | Fukuzawa et al. | |
| 8,120,126 B2 * | 2/2012 | Lee et al. | 257/421 |
| 2010/0078742 A1 | 4/2010 | Zheng et al. | |

OTHER PUBLICATIONS

S. Bala Kumar, et al., "Effect of Interfacial Spin Flip and Momentum Scattering on Magnetoresistance", IEEE Transactions on Magnetics, vol. 43, No. 6, Jun. 2007, pp. 2863-2865.

* cited by examiner

*Primary Examiner* — Mark Blouin

(57) ABSTRACT

A method and system for providing a magnetic read transducer is described. The magnetic read transducer includes a magnetoresistive sensor a shield, and a spin pumping barrier layer. The magnetoresistive sensor includes a pinned layer, a spacer layer, and a free layer. The spacer layer is nonmagnetic and resides between the pinned layer and the free layer. The free layer is between the pinned layer and the shield. The spin pumping barrier layer is between the shield and the free layer.

23 Claims, 6 Drawing Sheets

METHOD AND SYSTEM FOR PROVIDING A MAGNETIC READ TRANSDUCER HAVING AN IMPROVED SIGNAL TO NOISE RATIO

BACKGROUND

FIG. 1 depicts a portion of a conventional magnetic transducer 10, such as a conventional read transducer or other device. The conventional transducer 10 resides on a conventional substrate 11, such as an AlTiC substrate. The conventional transducer 10 includes a conventional bottom shield 12, conventional sensor 20, and conventional top shield 40. The transducer 10 also typically includes seed layer(s) (not shown) between the conventional AFM layer 22 and the conventional shield 12. The conventional shields 12 and 40 typically include NiFe and are formed by plating. The sensor 20 is shown in a current-perpendicular to plane (CPP) configuration. In a CPP configuration, read current is driven generally perpendicular to the plane of the layers of the device, along the z-axis shown.

The conventional sensor 20 includes a conventional antiferromagnetic (AFM) layer 22, a conventional synthetic antiferromagnet (SAF) 24, a conventional tunneling barrier layer 32, and a conventional free layer 34. Also shown is a conventional capping layer 36 for the conventional sensor 20. The conventional free layer 34 has a magnetization that is substantially free to change direction in response to an applied magnetic field, for example from a bit being read. The conventional tunneling barrier layer 32 may allow conduction through the sensor 20 via tunneling. The sensor 20 is thus a tunneling magnetoresistive (TMR) sensor. Note that if a conductive spacer layer is used instead of the barrier layer 32, then the sensor 20 is a spin valve. The conventional SAF layer 24 typically includes two ferromagnetic layers 26 and 30 separated by a nonmagnetic spacer layer 28. The ferromagnetic layers are generally antiferromagnetically coupled. The magnetization(s) of the conventional SAF layer 24 are pinned by the conventional AFM layer 22. More specifically, the first ferromagnetic layer 26, typically termed the pinned layer, has its magnetization pinned by the conventional AFM layer 22, for example via exchange interaction. The remaining ferromagnetic layer, or reference layer 30, has its magnetization pinned because it is strongly magnetically coupled with the pinned layer 26.

Although the conventional sensor 20 functions, the conventional transducer 10 may have limited utility. For example, conventional sensor 20 may be subject to noise. As recording densities increase, the read signal due to data recorded on the media may decrease. However, there may be no attendant reduction in the noise from the conventional sensor 24. The signal-to-noise ratio (SNR), the magnitude of the signal divided by the magnitude of the noise, may decrease. As a result, it may be difficult or impossible to correctly reading data from the media reliably using the conventional read sensor 20.

Accordingly, what is needed is a system and method for providing a read transducer having improved performance.

BRIEF SUMMARY OF THE INVENTION

A method and system for providing a magnetic read transducer is described. The magnetic read transducer includes a magnetoresistive sensor a shield, and a spin pumping barrier layer. The magnetoresistive sensor includes a pinned layer, a spacer layer, and a free layer. The spacer layer is nonmagnetic and resides between the pinned layer and the free layer. The free layer is between the pinned layer and the shield. The spin pumping barrier layer is between the shield and the free layer.

DETAILED DESCRIPTION OF THE PREFERRED EMBODIMENTS

Figure 1:
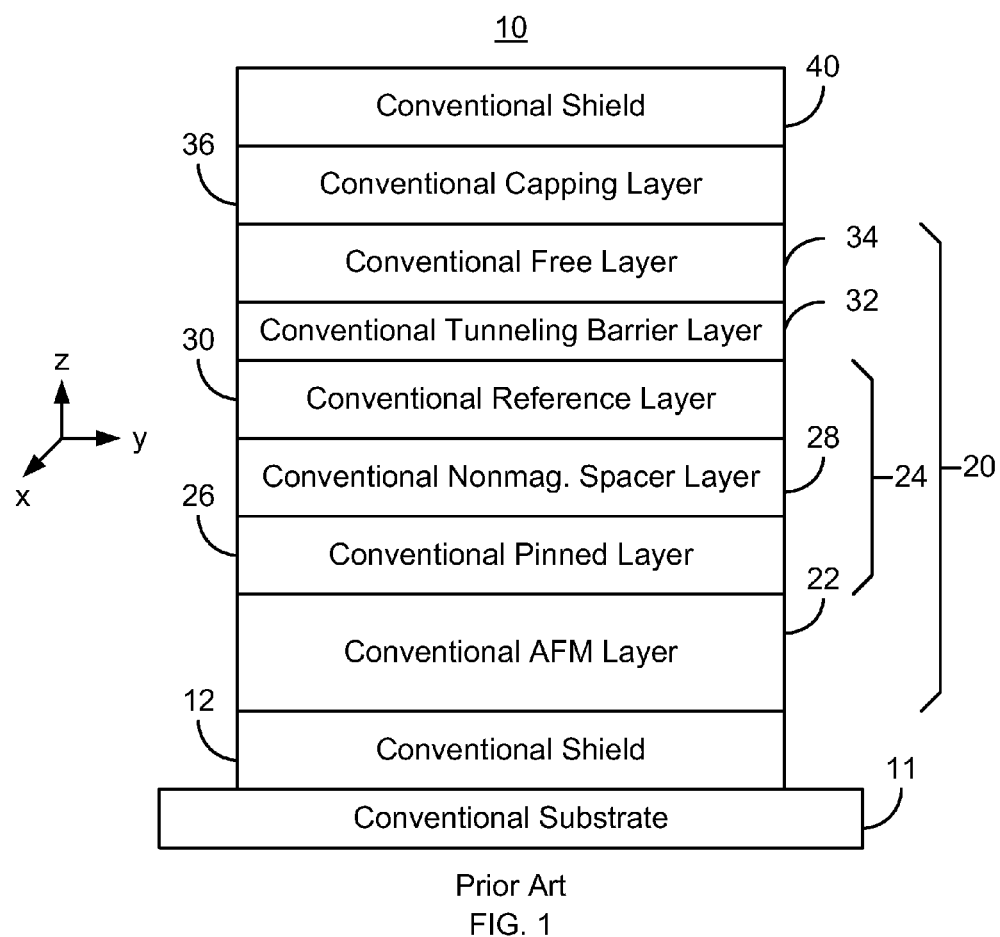
FIG. 1 is a diagram of a portion of a conventional transducer including a conventional sensor.
Figure 2:
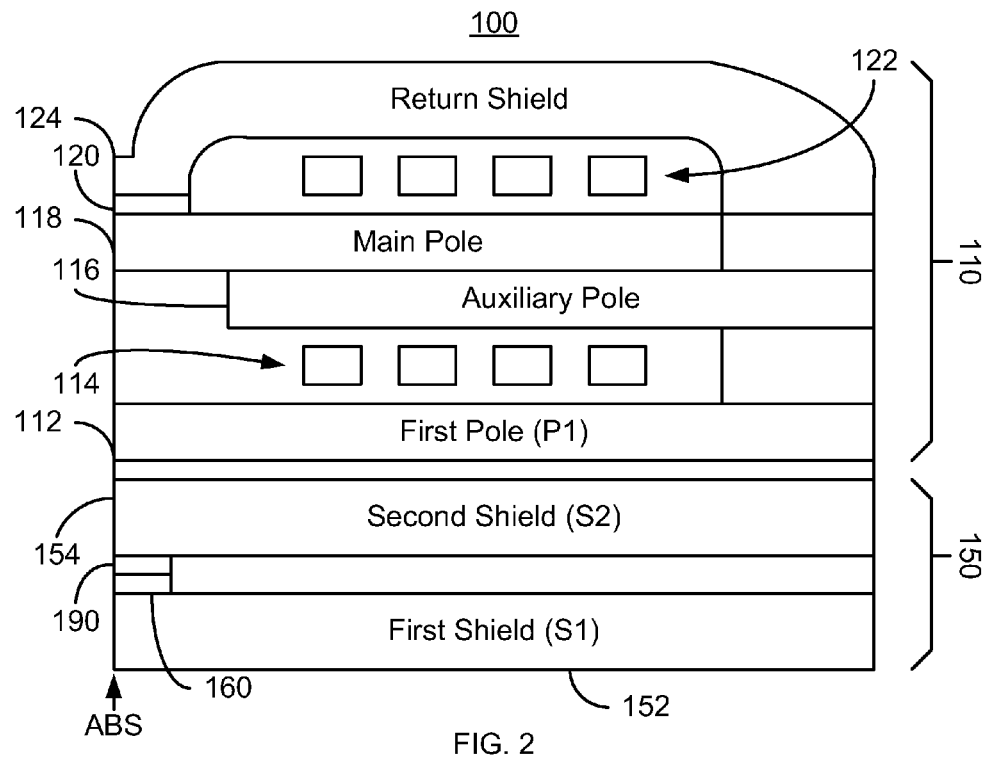
FIG. 2 depicts an exemplary embodiment of a head including an exemplary embodiment of a transducer.

FIG. 2 depicts a magnetic head 100. FIG. 2 is not to scale and not all components of the magnetic head 100 are shown. The magnetic head 100 is a merged head that includes a magnetic write transducer 110 and a magnetic read transducer 150. In other embodiments, the read transducer 150 and write transducer 110 may also be in separate heads. The magnetic head 100 resides on a slider and is typically one of many magnetic heads in a disk drive and used to write to and read from a media (not shown). The write transducer 110 includes a first pole 112, auxiliary pole 116, main pole 118, write gap 120, coils 114 and 122, and return shield 124. However, in another embodiment, the write transducer 110 includes other and/or different components. In addition, one or more portions of the write transducer 110 might be omitted in various embodiments.

The read transducer 150 includes shields 152 and 154, read sensor 160, and spin pumping barrier layer 190. The sensor 160 may be used to read data from a media (not shown). The shields 152 and 154 may be a soft magnetic material, such as NiFe. The shields 152 and 154 magnetically isolate the sensor 160 from bits not being read during operation of the transducer 150. The spin pumping barrier layer 190 may be used to reduce or substantially eliminate spin pumping current from the sensor 160 to the shield 154. Thermal fluctuations in a magnetic layer generate a spin current exiting the free layer. Thus, the spins in this current are oriented in the direction of the moment of the layer. This spin polarized current is the spin pumping current, which is a source of noise. As discussed below, the reduction in spin pumping current may reduce the noise from sensor 160 and thus improve performance of the transducer 150.

Figure 3:
FIG. 3 depicts an exemplary embodiment of a read transducer.

FIG. 3 depicts an exemplary embodiment of the read transducer 150 as used in the magnetic recording head 100. For clarity, FIG. 3 is not to scale. The transducer 150 is also described in the context of particular layers. However, in some embodiments, such layers may include sub-layer(s). The read transducer 150 is shown in a CPP configuration. Thus, sensor 160 is electrically connected to the shields 152 and 154. However, in another embodiment, a gap may exist between the sensor 160 and the shields 152 and/or 154. Further, a configuration other than CPP might be used. The read transducer 150 is also described in the context of particular layers. However, in some embodiments, such layers may include sub-layer(s).

The sensor 160 includes a pinned layer 170, a nonmagnetic layer 180, and a free layer 185. In some embodiments, other components may be included as part of the sensor 160 and/or the transducer 150. For example, the sensor 160 might also include seed layer(s), and/or additional layers. Further, the transducer 150 may include capping layer(s) and/or additional layers.

The pinned layer 170 has its magnetization fixed, or pinned in place. This may be accomplished in a variety of ways. The pinned layer 170 may be self-pinned or may be magnetically coupled with another layer, such as a pinning layer (not shown) that fixes the magnetization of the pinned layer 170. Such a pinning layer may be a magnetically had layer that magnetically biases the pinned layer 170 or an antiferromagnetic (AFM) layer. The pinned layer may be a single, a multilayer such as a SAF, or other structure.

The free layer 185 includes one or more ferromagnetic layers (not separately shown in FIG. 3). At least some of these ferromagnetic layers may be spaced by nonmagnetic layers. In the embodiment shown in FIG. 3, the free layer 185 is a sensor layer for the head 100. The nonmagnetic layer 180 separates the free layer 185 from the pinned layer 170. The nonmagnetic layer 180 may be desired to support a large magnetoresistance for the sensor 160. In some embodiments, the nonmagnetic layer 180 is an insulating, tunneling barrier layer. For example, the nonmagnetic layer 180 may be a crystalline tunneling barrier layer. In some such embodiments, the crystalline tunneling barrier may include or be composed of crystalline MgO. In other embodiments, the nonmagnetic layer 180 may be conductive and/or have another structure.

Also shown is a spin pumping barrier layer 190. The spin pumping barrier layer 190 may include at least one layer. The spin pumping barrier layer 190 resides between the free layer 185 and the shield 154. In some embodiments, the spin pumping barrier layer 190 adjoins the free layer 185. Thus, in these embodiments, the spin pumping barrier layer 190 and the free layer 185 share an interface. In other embodiments, however, one or more layer(s) may reside between the free layer 185 and the spin pumping barrier layer 190. The spin pumping barrier layer 190 is also shown as adjoining the shield 154. However, in other embodiments, other layer(s) may be between the spin pumping barrier layer 190 and the shield 154.

The spin pumping barrier layer 190 may reduce loss of spin information from the free layer 185. More specifically, the spin pumping barrier layer 190 reduces the spin pumping current from the free layer 185 to the shield 154. To do so, the spin pumping barrier layer 190 is generally desired to have a higher rate of momentum scattering, but a low rate of spin flip scattering for charge carriers. In some embodiments, the spin pumping barrier layer 190 is a non-spin flip scattering layer. Stated differently, charge carriers scattering from the spin pumping barrier layer 190 tend not to have their spins flipped by scattering. The charge carriers' spin information is thus preserved through the scattering. In some embodiments, the spin pumping barrier layer 190 is a tunneling barrier layer. For example, the spin pumping barrier layer 190 may include an insulator and/or a semiconductor. Materials that may be used include at least one of MgO, aluminum oxide, titanium oxide, tantalum oxide, zinc oxide, MgZnO, Si, Ge, ZnSe, Ta, and copper oxide. Further, the spin pumping barrier layer 190 need not support a large magnetoresistance for scattering occurring in the spin pumping barrier layer 190. Consequently, the materials selected for the spin pumping barrier layer 190 need not have a high magnetoresistance. For example, the spin pumping barrier layer 190 need not include crystalline MgO. Instead, the spin pumping barrier layer 190 may include either crystalline MgO or amorphous MgO. In embodiments in which the spin pumping barrier layer 190 is a tunneling barrier layer, the spin pumping barrier layer 190 has a thickness not more than twenty-five Angstroms. In some such embodiments, the thickness of the spin pumping barrier layer 190 is at least five and not more than fifteen Angstroms. Such thicknesses may control the contribution of the spin pumping barrier layer 190 to the total resistance of the transducer 150. The ability of the spin pumping barrier layer 190 to reduce spin pumping may also be characterized based on resistance area product (RA). The sensor 160 has a sensor RA. The spin pumping barrier layer 190 would then have an RA of not more than twenty percent of the sensor RA. In some such embodiments, the spin pumping barrier layer 190 has a RA that is not more than ten percent of the sensor RA. Further, the RA of the spin pumping barrier layer 190 may be at least 0.1 m$\Omega$-$\mu$m$^2$. In other embodiments, the RA of the spin pumping barrier layer 190 is at least 10 m$\Omega$-$\mu$m$^2$. Finally, in some embodiments, the second RA of the spin pumping barrier layer 190 is not more than 100 m$\Omega$-$\mu$m$^2$.

The spin pumping barrier layer 190 thus has a small RA in comparison with the sensor 160. As a result, the impedance of the read transducer 150 is not significantly altered by the presence of the spin pumping barrier layer 190. However, the charge carriers that do scatter from the spin pumping barrier layer 190 have their spin information preserved. Charge carriers from the free layer 185 scattered by the spin pumping barrier layer 190 may return to the free layer with their spin information intact. The net flow of angular momentum from the free layer 185 may be reduced. Thus, the spin pumping current from the free layer 185 is reduced.

Use of the spin pumping barrier layer 190 may increase the signal-to-noise ratio (SNR) of the sensor 160. The noise from the sensor 160 is proportional to the temperature and damping constant of the free layer 185 and inversely proportional to the free layer magnetic moment and effective field. The damping constant of the free layer 185 increases as the spin pumping current increases. The reduction in spin pumping current due to the spin pumping barrier layer 190 reduces the damping constant of the free layer 185. Consequently, the noise due to the free layer 185 is reduced. The SNR of the sensor 160 may thus be increased. Consequently, performance of the sensor 160 and the transducer 150 may be enhanced.

Figure 4:
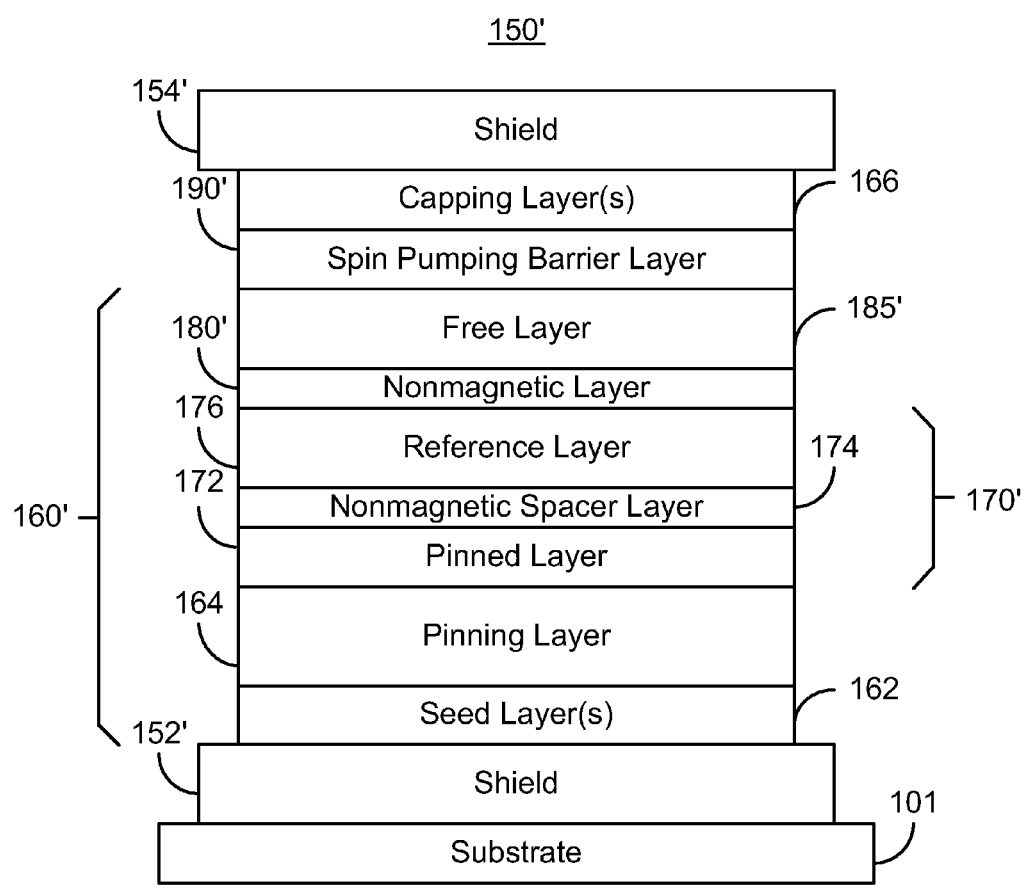
FIG. 4 depicts another exemplary embodiment of a read transducer.

FIG. 4 depicts another exemplary embodiment of a read transducer 150' including a spin barrier layer 190'. For clarity, FIG. 4 is not to scale. The transducer 150' is also described in the context of particular layers. However, in some embodiments, such layers may include sub-layer(s). The read transducer 150' is shown in a CPP configuration. Thus, sensor 160' is electrically connected to the shields 152' and 154'. However, in another embodiment, a gap may exist between the sensor 160' and the shields 152' and/or 154'. A configuration other than CPP may also be used. The read transducer 150' is also described in the context of particular layers. However, in some embodiments, such layers may include sub-layer(s).

Portions of the transducer 150' are analogous to those of the head 100 and transducer 150 shown in FIGS. 2-3. Such analogous structures are labeled similarly. The transducer 150' thus includes shields 152' and 154', sensor 160', and spin pumping barrier layer 190' that are analogous to the shields 152 and 154, sensor 160, and spin pumping barrier layer 190, respectively. Similarly, the sensor 160' includes a pinned layer 170', a nonmagnetic layer 180', and a free layer 185' that are analogous to the pinned layer 170, the nonmagnetic spacer 180, and the free layer 185, respectively. In addition, a pinning layer 164 and capping layer 166 are shown. The pinning layer 164 may, for example, be an antiferromagnetic material such as PtMn and/or IrMn. However, other materials may be used.

The pinned layer 170' is a SAF including a pinned layer 172, a nonmagnetic spacer layer 174, and a reference layer 176. The pinned layer 172 has its magnetization fixed, or pinned in place by the pinning layer 164. The reference layer 176 is magnetically coupled to the pinned layer 172 and has its magnetization fixed through this interaction. In other embodiments, the pinned layer 170' may have another structure, such as a single layer or a multilayer. The free layer 185' includes one or more ferromagnetic layers (not separately shown in FIG. 4) and is the sensor layer for the sensor 160'. In some embodiments, the free layer 185' may also include nonmagnetic layers. The nonmagnetic layer 180' separates the free layer 185' from the pinned layer 170'. The nonmagnetic layer 180' may also be desired to support a large magnetoresistance for the sensor 160'. In some embodiments, the nonmagnetic layer 180' is an insulating, tunneling barrier layer, such as crystalline MgO. In other embodiments, the nonmagnetic layer 180' may be conductive and/or have another structure.

The capping layer 166 is nonmagnetic and may include materials such as Ta. In some embodiments, the capping layer 166 may have a long spin diffusion length. For example, the spin diffusion length may be five to ten times the thickness of the capping layer 166. However, in other embodiments, the capping layer 166 may have a shorter spin diffusion length.

Also shown is a spin pumping barrier layer 190' analogous to the spin pumping barrier layer 190'. In the embodiment shown, the spin pumping barrier layer 190' adjoins the free layer 185'. In other embodiments, a layer may exist between the free layer 185' and the spin pumping barrier layer 190'. Further, the spin pumping barrier layer 190' is between the free layer 185' and the scapping layer 166 pin pumping barrier layer 190'.

The spin pumping barrier layer 190' may reduce loss of spin information for the free layer 185' by reducing the spin pumping current from the free layer 185' to the shield 154'. In some embodiments, the spin pumping barrier layer 190' is a non-spin flip scattering layer. In some embodiments, the spin pumping barrier layer 190' is a tunneling barrier layer. For example, the spin pumping barrier layer 190' may include an insulator and/or a semiconductor such as the materials discussed above. Materials that may be used include at least one of crystalline or amorphous MgO, aluminum oxide, titanium oxide, tantalum oxide, zinc oxide, MgZnO, Si, Ge, ZnSe, Ta, and copper oxide. In some embodiments, the spin pumping barrier layer 190' has a thickness not more than twenty-five Angstroms. In some such embodiments, the thickness of the spin pumping barrier layer 190' is at least five and not more than fifteen Angstroms. The spin pumping barrier layer 190' may have an RA of not more than twenty percent of the sensor RA. In some such embodiments, the spin pumping barrier layer 190' has a RA that is not more than ten percent of the sensor RA. Further, the RA of the spin pumping barrier layer 190' may be at least $0.1$ m$\Omega$-$\mu$m$^2$. In other embodiments, the RA of the spin pumping barrier layer 190' is at least 10 m$\Omega$-$\mu$m$^2$. Finally, in some embodiments, the second RA of the spin pumping barrier layer 190' is not more than 100 m$\Omega$-$\mu$m$^2$.

Use of the spin pumping barrier layer 190' may increase the signal-to-noise ratio (SNR) of the sensor 160'. The noise from the sensor 160' increases as the spin pumping current increases. The reduction in spin pumping current due to the spin pumping barrier layer 190' reduces the damping constant of the free layer 185. Consequently, the noise due to the free layer 185' is reduced. The SNR of the sensor 160' may thus be increased. The spin pumping barrier layer 190' has a small RA in comparison with the sensor 160'. As a result, the impedance of the read transducer 150' is asp not significantly altered by the presence of the spin pumping barrier layer 190'. Consequently, performance of the transducer 150' may be enhanced.

Figure 5:
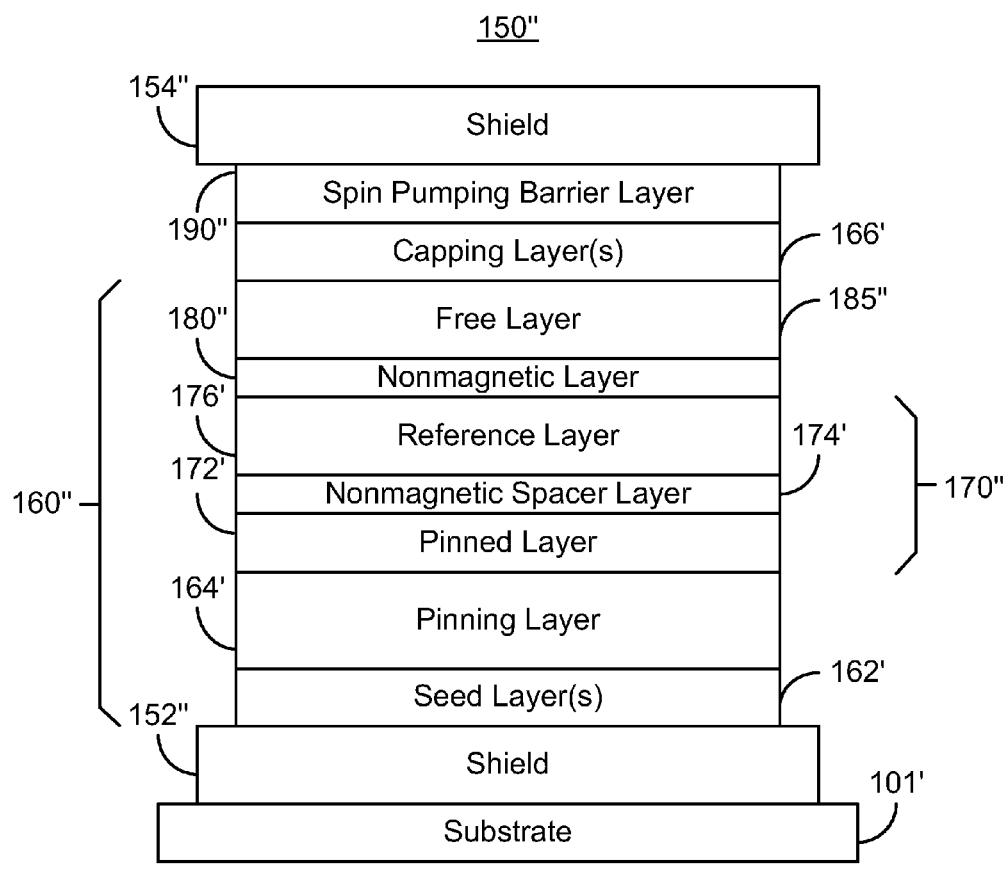
FIG. 5 depicts another exemplary embodiment of a read transducer.

FIG. 5 depicts another exemplary embodiment of a read transducer 150" including a spin barrier layer 190". For clarity, FIG. 5 is not to scale. The transducer 150" is also described in the context of particular layers. However, in some embodiments, such layers may include sub-layer(s). The read transducer 150" is shown in a CPP configuration. Thus, sensor 160" is electrically connected to the shields 152" and 154". However, in another embodiment, a gap may exist between the sensor 160" and the shields 152" and/or 154". A configuration other than CPP may also be used. The read transducer 150" is also described in the context of particular layers. However, in some embodiments, such layers may include sub-layer(s).

Portions of the transducer 150" are analogous to those of the head 100 and transducers 150/150' shown in FIGS. 2-4. Such analogous structures are labeled similarly. The transducer 150" thus includes shields 152" and 154", sensor 160", and spin pumping barrier layer 190" that are analogous to the shields 152/152' and 154/154', sensor 160/160', and spin pumping barrier layer 190/190', respectively. Similarly, the sensor 160" includes a pinned layer 170", a nonmagnetic layer 180", and a free layer 185" that are analogous to the pinned layer 170/170', the nonmagnetic spacer 180/180', and the free layer 185/185', respectively. In addition, a pinning layer 164' and capping layer 166' are shown. The pinning layer 164' may, for example, be an antiferromagnetic material such as PtMn and/or IrMn. However, other materials may be used.

The pinned layer 170" is a SAF including a pinned layer 172', a nonmagnetic spacer layer 174', and a reference layer 176'. However, in other embodiments, the pinned layer 170" may have another structure, such as a single layer or a multilayer. The free layer 185" includes one or more ferromagnetic layers (not separately shown in FIG. 5) and is the sensor layer for the sensor 160". The free layer 185' may also include nonmagnetic layers. The nonmagnetic layer 180" separates the free layer 185" from the pinned layer 170". The nonmagnetic layer 180" may be desired to support a large magnetoresistance for the sensor 160". In some embodiments, the nonmagnetic layer 180" is an insulating, tunneling barrier layer, such as crystalline MgO. In other embodiments, the nonmagnetic layer 180" may be conductive and/or have another structure.

The capping layer 166' is nonmagnetic and may include materials such as Ta. In some embodiments, the capping layer 166' may have a long spin diffusion length. A long spin diffusion length is greater than the thickness of the layer. In some embodiments, the long spin diffusion length for the capping layer 166' may be five to ten times the thickness of the capping layer 166'. However, in other embodiments, the capping layer 166' may have a shorter spin diffusion length.

Also shown is a spin pumping barrier layer 190" analogous to the spin pumping barrier layer 190". In the embodiment shown, the capping layer 166' is between the spin pumping barrier layer 190" and the free layer 185". In such embodiments, a capping layer 166' having a high spin diffusion length may be desired.

The spin pumping barrier layer 190" may reduce loss of spin information for the free layer 185" by reducing the spin pumping current from the free layer 185" to the shield 154". The ability of the spin pumping barrier layer 190" to reduce this spin pumping current may be enhanced by a capping layer 166' having a long spin diffusion length. In such an embodiment, charge carriers from the free layer 185" are less likely to undergo spin flip scattering in the capping layer 166. Thus, it is more likely that charge carriers from the free layer 185" will retain their spin information upon reaching the spin pumping barrier layer 190". Thus, the spin pumping barrier layer 190" may be better able to scatter charge carriers from the free layer 185" in a manner that preserves their spin original information. The scattered charge carriers are also more likely to return to the free layer 185' without undergoing spin flip scattering in the capping layer 166'.

In some embodiments, the spin pumping barrier layer 190" is a non-spin flip scattering layer. In some embodiments, the spin pumping barrier layer 190" is a tunneling barrier layer. For example, the spin pumping barrier layer 190" may include an insulator and/or a semiconductor. Materials that may be used include at least one of crystalline or amorphous MgO, aluminum oxide, titanium oxide, tantalum oxide, zinc oxide, MgZnO, Si, Ge, ZnSe, Ta, and copper oxide. In some embodiments, the spin pumping barrier layer 190" has a thickness not more than twenty-five Angstroms. In some such embodiments, the thickness of the spin pumping barrier layer 190" is at least five and not more than fifteen Angstroms. The spin pumping barrier layer 190" may have an RA of not more than twenty percent of the sensor RA. In some such embodiments, the spin pumping barrier layer 190" has a RA that is not more than ten percent of the sensor RA. Further, the RA of the spin pumping barrier layer 190" may be at least $0.1$ m$\Omega$-$\mu$m$^2$. In other embodiments, the RA of the spin pumping barrier layer 190" is at least $10$ m$\Omega$-$\mu$m$^2$. Finally, in some embodiments, the second RA of the spin pumping barrier layer 190" is not more than $100$ m$\Omega$-$\mu$m$^2$.

The transducer 150" may share the benefits of the transducers 150 and 150'. More specifically, the noise from the sensor 160" may be reduced through a reduction in the spin pumping current from the free layer 185". The SNR of the sensor 160" may thus be increased. This benefit may be achieved without altering the RA of the sensor 190". Consequently, performance of the transducer 150" may be enhanced.

Figure 6:
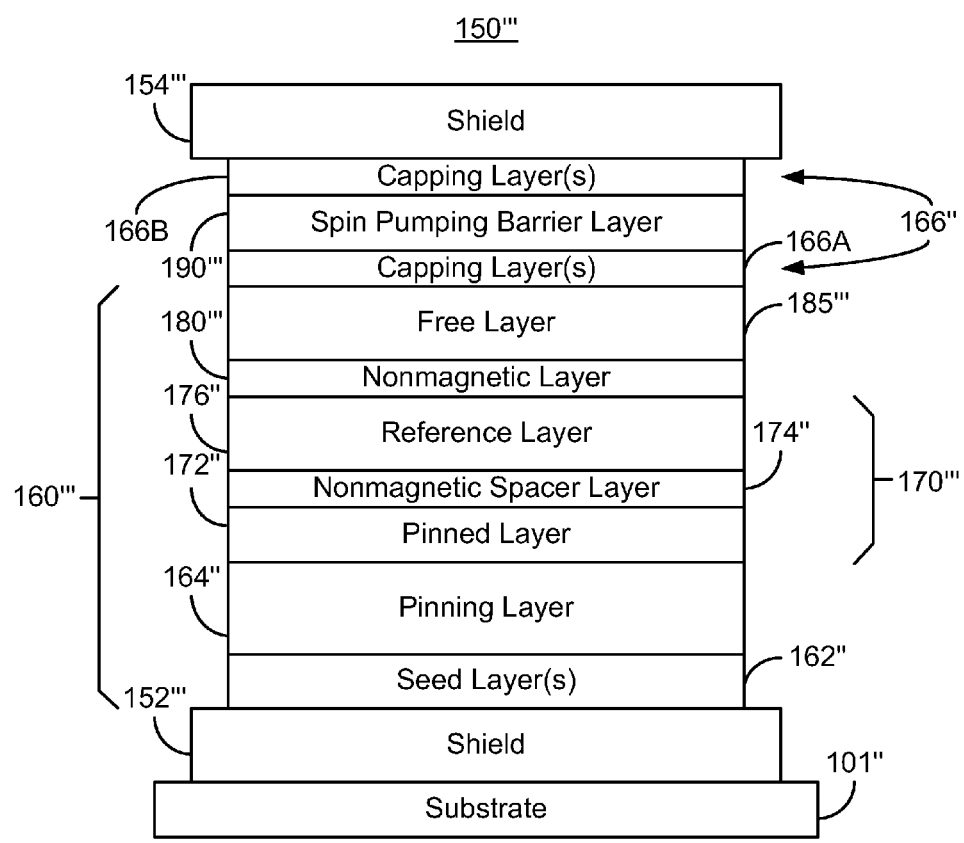
FIG. 6 depicts another exemplary embodiment of a read transducer.

FIG. 6 depicts another exemplary embodiment of a read transducer 150''' including a spin barrier layer 190'''. For clarity, FIG. 6 is not to scale. The transducer 150''' is also described in the context of particular layers. However, in some embodiments, such layers may include sub-layer(s). The read transducer 150''' is shown in a CPP configuration. Thus, sensor 160''' is electrically connected to the shields 152''' and 154'''. However, in another embodiment, a gap may exist between the sensor 160''' and the shields 152''' and/or 154'''. A configuration other than CPP may also be used. The read transducer 150''' is also described in the context of particular layers. However, in some embodiments, such layers may include sub-layer(s).

Portions of the transducer 150''' are analogous to those of the head 100 and transducers 150/150'/150" shown in FIGS. 2-5. Such analogous structures are labeled similarly. The transducer 150" thus includes shields 152''' and 154''', sensor 160''', and spin pumping barrier layer 190''' that are analogous to the shields 152/152'/152" and 154/154'/154", sensor 160/160'/160", and spin pumping barrier layer 190/190'/190", respectively. Similarly, the sensor 160''' includes a pinned layer 170''', a nonmagnetic layer 180''', and a free layer 185''' that are analogous to the pinned layer 170/170'/170", the nonmagnetic spacer 180/180'/180", and the free layer 185/185'/185", respectively. In addition, a pinning layer 164" and capping layer 166" are shown. The pinning layer 164" may, for example, be an antiferromagnetic material such as PtMn and/or IrMn. However, other materials may be used.

The pinned layer 170''' is a SAF including a pinned layer 172", a nonmagnetic spacer 174", and a reference layer 176". The pinned layer 172" has its magnetization fixed, or pinned in place by the pinning layer 164". The reference layer 176" has its magnetization pinned by a magnetic coupling to the pinned layer 172". The free layer 185''' includes one or more ferromagnetic layers (not separately shown in FIG. 6) and is the sensor layer for the sensor 160'''. The nonmagnetic layer 180''' separates the free layer 185''' from the pinned layer 170'''. The nonmagnetic layer 180''' may be desired to support a large magnetoresistance for the sensor 160'''. In some embodiments, the nonmagnetic layer 180''' is an insulating, tunneling barrier layer, such as crystalline MgO. In other embodiments, the nonmagnetic layer 180''' may be conductive and/or have another structure.

The capping layer 166" is nonmagnetic and may include materials such as Ta. In some embodiments, the capping layer 166" may have a long spin diffusion length. A long spin diffusion length is greater than the thickness of the layer. For example, the long spin diffusion length for the capping layer 166" may be five to ten times the thickness of the capping layer 166". However, in other embodiments, the capping layer 166" may have a shorter spin diffusion length.

Also shown is a spin pumping barrier layer 190''' analogous to the spin pumping barrier layer 190'''. In the embodiment shown, the spin pumping barrier layer 190''' resides in the capping layer 166". Thus, the capping layer 166" includes sublayers 166A and 166B. In such embodiments, a capping layer 166" having a high spin diffusion length may be desired for the reasons discussed with respect to FIG. 5.

The spin pumping barrier layer 190''' may reduce loss of spin information for the free layer 185''' by reducing the spin pumping current from the free layer 185''' to the shield 154'''. The ability of the spin pumping barrier layer 190''' to reduce this spin pumping current may be enhanced by a capping layer 166" having a long spin diffusion length. In such an embodiment, charge carriers from the free layer 185''' are less likely to scatter in the capping layer 166". Thus, it is more likely that charge carriers from the free layer 185''' will retain their spin information upon reaching the spin pumping barrier layer 190'''. Thus, the spin pumping barrier layer 190''' may be better able to scatter charge carriers from the free layer 185''' in a manner that preserves their spin original information.

In some embodiments, the spin pumping barrier layer 190''' is a non-spin flip scattering layer. In some embodiments, the spin pumping barrier layer 190''' is a tunneling barrier layer. For example, the spin pumping barrier layer 190''' may include an insulator and/or a semiconductor. Materials that may be used include at least one of crystalline or amorphous MgO, aluminum oxide, titanium oxide, tantalum oxide, zinc oxide, MgZnO, Si, Ge, ZnSe, Ta, and copper oxide. In some embodiments, the spin pumping barrier layer 190''' has a thickness not more than twenty-five Angstroms. In some such embodiments, the thickness of the spin pumping barrier layer 190''' is at least five and not more than fifteen Angstroms. The spin pumping barrier layer 190''' may have an RA of not more than twenty percent of the sensor RA. In some such embodiments, the spin pumping barrier layer 190" has a RA that is not more than ten percent of the sensor RA. Further, the RA of the spin pumping barrier layer 190" may be at least $0.1$ m$\Omega$-$\mu$m$^2$. In other embodiments, the RA of the spin pumping barrier layer 190''' is at least 10 mΩ-μm². Finally, in some embodiments, the second RA of the spin pumping barrier layer 190''' is not more than 100 mΩ-μm².

The transducer 150''' may share the benefits of the transducers 150, 150', and 150''. More specifically, the noise from the sensor 160''' may be reduced through a reduction in the spin pumping current from the free layer 185'''. The SNR of the sensor 160''' may thus be increased. This benefit may be achieved without altering the RA of the sensor 190'''. Consequently, performance of the transducer 150''' may be enhanced.

Figure 7:
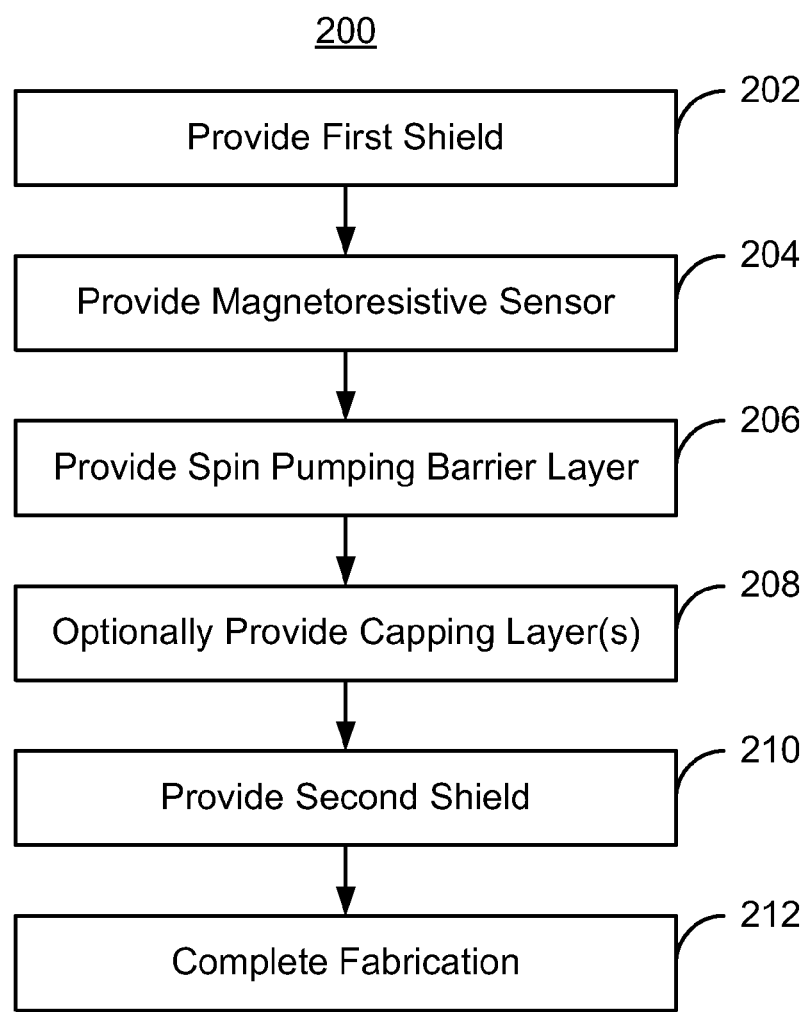
FIG. 7 depicts an exemplary embodiment of a method of forming an exemplary embodiment of a read transducer.

FIG. 7 depicts an exemplary embodiment of a method 200 of forming an exemplary embodiment of a read transducer including a spin pumping barrier layer. For simplicity, some steps may be omitted, combined, and/or interleaved. The method 300 is described in the context of the transducers 150/150'/150''/150'''. However, the method 200 may be used for other transducers. The method 200 also may commence after formation of other structures of the read and/or write transducer. The method 200 is also described in the context of providing a single transducer 150/150'/150''/150'''. However, the method 200 may be used to fabricate multiple structures at substantially the same time. The method 200 and structures such as the transducers 150/150'/150''/150''' are also described in the context of particular layers. However, in some embodiments, such layers may include sub-layer(s).

The first shield 152/152'/152''/152''' is provided, via step 202. In some embodiments, the first shield 152/152'/152''/152''' is plated on the substrate 151/151'/151''/151'''. However, in other embodiments, first shield 152/152'/152''/152''' is deposited in another manner and/or on another structure.

The magnetoresistive sensor 160/160'/160''/160''' is provided, via step 204. In some embodiments, step 204 includes depositing a stack including the layers for the magnetoresistive sensor 160/160'/160''/160''' and defining the magnetoresistive sensor 160/160'/160''/160''' from the stack. Step 204 may also include providing insulating layers, hard bias layers and/or other structures.

The spin pumping barrier layer 190/190'/190''/190''' is provided, via step 206. Step 206 may include providing a barrier layer or other structure. The capping layer 166/166'/166'' may also optionally be provided, via step 208. Note that for the transducer 150'', step 208 may be performed before step 206. For the transducer 150''', steps 208 and 206 may be interleaved. Step 208 may include depositing layer(s) such as Ta. Deposition of the spin pumping barrier layer 190 in step 206 and/or the capping layer 166 in step 208 may be performed as part of deposition of the read sensor stack in step 204. The second shield 154/154'/154''/154''' may then be provided, via step 210. Step 210 may be performed in a manner analogous to step 202. Fabrication of the transducer 150/150'/150''/150''' may then be completed, via step 212.

Using the method 200 fabrication of the transducer 150/150'/150''/150''' may be completed. Thus, the benefits of the transducers 150/150'/150''/150''' may be achieved.

We claim:

1. A magnetic read transducer comprising:
a magnetoresistive sensor including a pinned layer, a spacer layer, and a free layer, the spacer layer being nonmagnetic and residing between the pinned layer and the free layer;
a shield, the free layer residing between the pinned layer and the shield; and
a spin pumping barrier layer between the shield and the free layer, wherein the spin pumping barrier layer includes at least one of aluminum oxide, titanium oxide, tantalum oxide, zinc oxide, Si, Ge, ZnSe, Ta, and copper oxide.

2. The magnetic read transducer of claim 1 wherein the spin pumping barrier layer is a non-spin flip scattering layer.

3. The magnetic read transducer of claim 1 wherein the spin pumping barrier layer is a tunneling barrier layer.

4. The magnetic read transducer of claim 3 wherein the spin pumping barrier layer has a thickness not more than twenty-five Angstroms.

5. The magnetic read transducer of claim 4 wherein the thickness is at least five and not more than fifteen Angstroms.

6. The magnetic read transducer of claim 1 wherein the spin pumping barrier layer includes amorphous MgO.

7. The magnetic read transducer of claim 1 wherein the magnetoresistive sensor has a first resistance area product (RA) and the spin pumping barrier layer has a second RA not more than twenty percent of the first RA.

8. The magnetic read transducer of claim 7 wherein the second RA is at least 0.1 mΩ-μm² and not more than ten percent of the first RA.

9. The magnetic read transducer of claim 8 wherein the second RA is at least 10 mΩ-μm².

10. The magnetic read transducer of claim 9 wherein the second RA is not more than 100 mΩ-μm².

11. The magnetic read transducer of claim 1 further comprising:
a capping layer residing between the free layer and the shield.

12. The magnetic read transducer of claim 11 wherein the spin pumping barrier layer is between the capping layer and the free layer.

13. The magnetic read transducer of claim 12 wherein the spin pumping barrier layer adjoins the free layer.

14. The magnetic read transducer of claim 11 wherein the capping layer is between the spin pumping barrier layer and the free layer.

15. The magnetic read transducer of claim 11 wherein the spin pumping barrier layer resides within the capping layer.

16. A magnetic read transducer comprising:
a first shield;
a magnetoresistive sensor including a pinned layer, a spacer layer, and a free layer, the spacer layer being a first tunneling barrier layer and residing between the pinned layer and the free layer, the magnetoresistive sensor having a first resistance area product (RA);
a second tunneling barrier layer adjoining the free layer, the free layer residing between the second tunneling barrier layer and the first tunneling barrier layer, the second tunneling barrier having a thickness of at least five and not more than fifteen Angstroms, the second tunneling barrier layer including MgO, the second tunneling barrier layer having a second RA not more than twenty percent of the first RA, the second RA being at least 10 mΩ-μm² and not more than 100 mΩ-μm², wherein the spin pumping barrier layer includes at least one of aluminum oxide, titanium oxide, tantalum oxide, zinc oxide, Si, Ge, ZnSe, Ta, and copper oxide;
a capping layer adjoining the second tunneling barrier layer, the second tunneling barrier layer residing between the capping layer and the free layer; and
a second shield, the capping layer residing between the free layer and the second shield.

17. A magnetic recording disk comprising:
a media;
a slider;
a read transducer coupled with the slider, the read transducer including a magnetoresistive sensor, a shield, and a spin pumping barrier layer, the magnetoresistive sensor including a pinned layer, a spacer layer, and a free layer, the spacer layer being nonmagnetic and residing between the pinned layer and the free layer, the free layer residing between the pinned layer and the shield, the spin pumping barrier layer residing between the shield and the free layer, the spin pumping barrier layer including at least one of aluminum oxide, titanium oxide, tantalum oxide, zinc oxide, Si, Ge, ZnSe, Ta, and copper oxide.

18. The disk drive of claim 17 wherein the spin pumping barrier layer is a tunneling barrier layer.

19. The disk drive of claim 18 wherein the spin pumping barrier layer has a thickness of at least five and not more than ten Angstroms.

20. The disk drive of claim 17 wherein the magnetoresistive sensor has a first resistance area product (RA) and the spin pumping barrier layer has a second RA not more than twenty percent of the first RA.

21. The disk drive of claim 17 further comprising:
a capping layer residing between the free layer and the shield.

22. The disk drive of claim 21 wherein the spin pumping barrier layer is between the capping layer and the free layer and wherein the spin pumping barrier layer adjoins the free layer.

23. A method for fabricating a magnetoresistive structure for use in a magnetic transducer, the method comprising:
providing a magnetoresistive sensor including a pinned layer, a spacer layer, and a free layer, the spacer layer being nonmagnetic and residing between the pinned layer and the free layer;
a spin pumping barrier layer, the spin pumping barrier layer including at least one of aluminum oxide, titanium oxide, tantalum oxide, zinc oxide, Si, Ge, ZnSe, Ta, and copper oxide;
providing a shield, the free layer residing between the pinned layer and the shield, the spin pumping barrier layer being between the shield and the free layer.

* * * * *